United States Patent [19]

Kasperkovitz

[11] Patent Number: 4,709,163

[45] Date of Patent: Nov. 24, 1987

[54] CURRENT-DISCRIMINATION ARRANGEMENT

[75] Inventor: Wolfdietrich G. Kasperkovitz, Eindhoven, Netherlands

[73] Assignee: U.S. Philips Corporation, New York, N.Y.

[21] Appl. No.: 469,544

[22] Filed: Mar. 16, 1983

[30] Foreign Application Priority Data

Mar. 10, 1982 [NL] Netherlands ......................... 8200974

[51] Int. Cl.[4] .......................... H03K 3/01; H03K 3/29

[52] U.S. Cl. .................................... 307/297; 307/270; 307/276; 307/289; 323/312

[58] Field of Search ........... 307/289, 291, 297, 272 R, 307/276, 270, 247 R; 328/147; 323/312, 314, 315

[56] References Cited

U.S. PATENT DOCUMENTS 3,218,613 11/1965 Gribble et al. ...................... 307/291
3,573,499 4/1971 Lynes ................................. 307/291
3,686,515 8/1972 Kadono .............................. 307/247
3,912,950 10/1975 Tada .................................. 307/289
3,953,746 4/1976 Fett ................................ 307/247 R
4,370,573 1/1983 Keene ................................. 307/291

*Primary Examiner*—Stanley D. Miller
*Assistant Examiner*—Timothy P. Callahan
*Attorney, Agent, or Firm*—Robert T. Mayer; Steven R. Biren

[57] ABSTRACT

A current-discrimination arrangement, in particular for use in stabilizing circuits, comprises two cross-coupled transistors. The current to be discriminated is applied in parallel to both transistors. For small currents both transistors conduct to the same extent, while at a current $I=2(KT/qR)$, in which R is the resistance value of the collector load impedances of the two transistors, the circuit becomes bistable. The steep characteristic at the transition from non-stable to the bistable operation is used as discrimination characteristic.

6 Claims, 3 Drawing Figures

CURRENT-DISCRIMINATION ARRANGEMENT

BACKGROUND OF THE INVENTION

The invention relates to a current-discrimination arrangement having an input for receiving a current to be discriminated and an output.

Such a current-discrimination arrangement may be used inter alia in current stabilizers but also in, for example, signal-level detectors.

In current stabilizers of the so-called "band-gap reference" type, as described inter alia in U.S. Pat. No. 3,887,863, such a current discrimination arrangement comprises two current paths, a semiconductor junction in one path being shunted by a semiconductor junction connected in series with a resistor in the other path. The currents in the two paths are compared by means of a resistor and a differential amplifier or by means of a current mirror—which comparison constitutes the discrimination function—and are controlled in such a way that the current densities in the two semiconductor junctions are in a ratio of 1:n, which factor $n \neq 1$ if the two semiconductor junctions are unequal or if the currents in the two paths are made unequal. The current is then stabilized at a value equal to (KT/qR) ln n, where K is Boltzmann's constant, T the absolute temperature in °K., q the elementary charge, R the value of said resistor, and ln n the natural logarithm of the factor n. In this type of stabilizer the current is stabilized at a value determined by the factor n. The steepness of the current discrmination is also determined by the factor n. The stabilization improves as the factor n deviates further from unity, but the circuit arrangement then becomes more asymmetrical, which is generally a disadvantage.

SUMMARY OF THE INVENTION

It is the object of the invention to provide a current discrimination arrangement which has a sharp discrimination characteristic, which is of a highly symmetrical circuit design, and which also discriminates around a value which is proportional to (kT/q). To this end the invention is characterized in that the current discrimination arrangement comprises a first transistor and a second transistor, each having a base electrode, an emitter electrode, and a collector electrode, the collector electrode of the first transistor being connected to a first point via a first resistor and the collector electrode of the second transistor being connected to said first point via a second resistor of substantially the same value as the first resistor, the base electrode of the first transistor being connected to a point between the second resistor and the collector electrode of the second transistor, and the base electrode of the second transistor to a point between the first resistor and the collector electrode of the first transistor, the emitter electrodes of the first and second transistors being connected to a second point, the circuit between the first point and the second point being arranged in series with the input to receive the current to be discrminated, and the output being coupled to at least one of the two collector electrodes.

In such a circuit arrangement the input current is distributed equally between the two collector-emitter circuits. As soon as the current has increased so far that the loop gain (from the base to the collector electrode) has become unity, the circuit becomes bistable, which is very easy to detect. The bistable condition is attended by a very steep characteristic: only a very small current increase will turn off one of the two transistors. This point where the circuit arrangement becomes bistable is reached for an input current equal to 2(KT/qR), where R is the value of the first resistor and the second resistor. In this respect it is advantageous if the output is a differential output between the collector electrodes of the first and second transistors. This results in a more strongly varying signal.

When the point is reached where the circuit arrangement becomes bistable, the circuit may assume either of two stable states. However, the circuit arrangement may be adapted so that the output signal is independent of which of the two states the circuit assumes. Suitably, however, there are provided means for defining a preferred state of conduction for the two transistors in the input-current range for which the cross-coupled first and second transistors form a bistable circuit, in such a way that when said bistable condition is reached the first transistor becomes more conductive and the second transistor is cut off.

A preferred embodiment of the discrimination arrangement may be characterized in that a third resistor is arranged between the collector electrode of the first transistor and the connection between the base electrode of the second transistor and the first resistor, a fourth resistor whose resistance value is higher than the resistance of the third resistor is arranged between the collector electrode of the second transistor and the connection between the base electrode of the first transistor and the second resistor, and the input of a differential amplifier is connected to the connections between said third and fourth resistors and the collector electrodes of the first and second transistors. As a result of this, the point where the differential amplifier is balanced—which point is more or less the center of the discrimination characteristic of the current-discrimination arrangement including the differential amplifier—is shifted from the boundary of the steep portion of the discrimination characteristic of the actual current discriminator to a point nearer the center of this steep portion, which for example provides better control in a current stabilizer. The last-mentioned preferred embodiment may be further characterized in that the differential amplifier comprises a third transistor and a fourth transistor with common emitter electrodes, the collector electrode of the third transistor being connected substantially directly to the first point and the collector electrode of the fourth transistor being connected to the base electrode of the fifth transistor whose emitter electrode is also connected to the first point, the base electrode of the third transistor being connected to the collector electrode of the second transistor, and the base electrode of the fourth transistor being connected to the collector electrode of a first transistor. Since, as a result of the base-emitter junction of the fifth transistor, the collector-base voltage of the fourth transistor for a small input current of the discrimination arrangement is substantially opposite and equal to one base-emitter voltage (of the fifth transistor) and since that of the third transistor is substantially zero volts, the base current of the fourth transistor will be greater than that of the third transistor, so that as a result of these base currents, which flow via the first resistor and the second resistor, the base of the first transistor has a higher bias than the base of the second transistor, so that the second transistor will always be cut-off when the bistable condition is reached.

BRIEF DECRIPTION OF THE DRAWING

The invention will now be described in more detail, by way of example, with reference to the drawing, in which.

DESCRIPTION OF THE PREFERRED EMBODIMENTS

Figure 1:
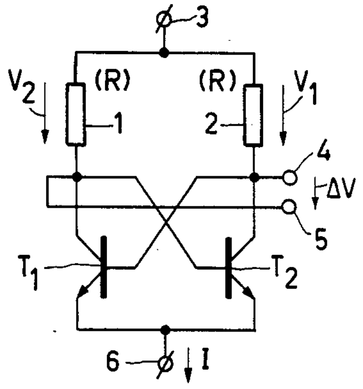
FIG. 1 shows a current discrimination arrangement in accordance with the invention.

FIG. 1 shows a current discrimination arrangement in accordance with the invention. The arrangement comprises a transistor $T_1$, whose emitter electrode is connected to a terminal 6 and whose collector electrode is connected to a terminal 3 via a resistor 1, and a transistor $T_2$ whose emitter electrode is connected to the terminal 6 and whose collector electrode is connected to the terminal 3 via a resistor 2. The base of transistor $T_1$ is connected to the collector of transistor $T_2$ and to an output terminal 4; and the base of transistor $T_2$ is connected to the collector of transistor $T_1$ and to an output terminal 5.

Figure 2:
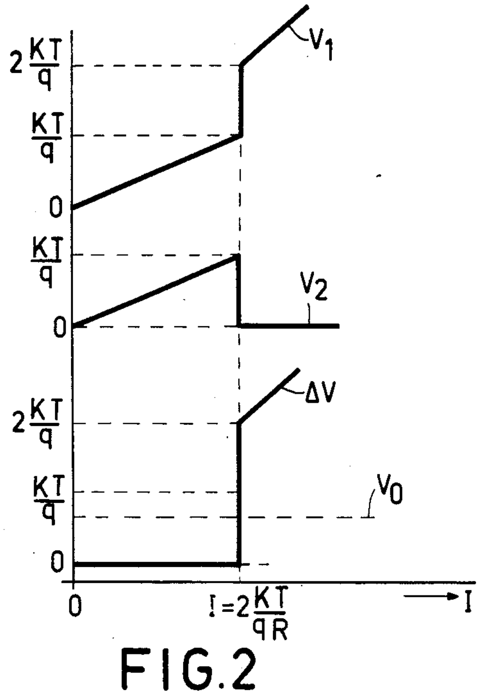
FIG. 2 shows some characteristics illustrating the operation of the arrangement shown in FIG. 1.

If a current I flows through the circuit between terminals 3 and 6—as a result of current drive on terminal 3 or 6—$V_1$ in FIG. 2 will be the voltage across the resistor 2, $V_2$ the voltage across the resistor 1, and $\Delta V$ the voltage between the output terminals 4 and 5. For small currents I the currents through the transistors $T_1$ and $T_2$ are equal and the voltages $V_1$ and $V_2$ are directly proportional to the current I, the difference voltage $\Delta V$ being zero. For a specific value of the current I, for which value the loop gain in the cross-coupling between the two transistors is unity, the circuit arrangement shown in FIG. 1 becomes bistable. This happens when the current I has reached the value 2(KT/qR). At this instant one of the two transistors $T_1$ and $T_2$ will draw the full current I.

It is assumed in FIG. 2 that transistor $T_2$ draws the full current I, as a result of which the voltage $V_1$ of (kT/q) is doubled so that $V_1=2(KT/q)$, the voltage $V_2$ becomes zero, and the difference voltage $\Delta V$ becomes 2(KT/q). At the current $I=2(KT/qR)$ at which the circuit becomes bistable $V_1$, $V_2$ and $\Delta V$ will vary as a function of the current I in accordance with a very steep characteristic. This portion of the characteristic is therefore eminently suitable as a discrimination characteristic. The voltages $V_1$ and $V_2$ and the difference voltage $\Delta V$ may be used for this purpose, the voltage $\Delta V$ available on the differential output (4, 5) being the most favorable choice in most cases. When the voltage $\Delta V$ is used as the discrimination voltage it is advantageous if this voltage is given approximately a value $V_1$ (FIG. 2), for example by introducing an offset $V_0$ in a differential amplifier which amplifies the voltage $\Delta V$, or by applying, for example, a level shift equal to $V_1$ in series with one of the two output terminals 4 and 5.

At the instant that the circuit arrangement shown in FIG. 1 becomes bistable it is not predictable which of the two transistors $T_1$ and $T_2$ will carry the current I. This need not present anyproblem. For example, a circuit may be added to output 4, 5, which circuit amplifies the voltage $\Delta V$ in polarity-independent manner, so that the bistable state of conduction is irrevelant. In order to simplify the circuit arrangement, however, it will be more advantageous to define the condition of the circuit arrangement after it has become bistable. This may be achieved in various ways inter alia by making the two transistors or the two collector loads slightly unequal or by applying an additional current to the collector circuit of one of the two transistors.

Figure 3:
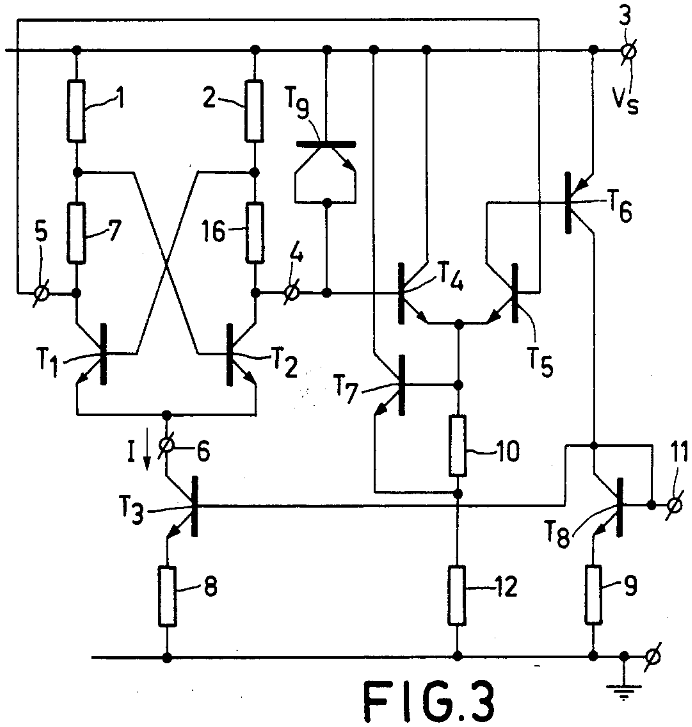
FIG. 3 shows a preferred current discriminator in accordance with the invention used in a voltage-reference source.

FIG. 3 shows an example of the circuit arrangement shown in FIG. 1 used in a current or voltage stablizing circuit. A current I is applied to the terminal 6 by means of a current-source transistor $T_3$ provided with an emitter resistor 8, terminal 3 being connected to a positive supply voltage VS. The output terminals 4 and 5 are connected to the base electrodes of two transistors $T_4$ and $T_5$, which are arranged as a differential amplifier whose common-emitter line includes a current source comprising the resistors 10 and 11 and a transistor $T_7$. The collector of transistor $T_4$ is connected directly to the power-supply terminal 3, while the collector of transistor $T_5$ is connected to the base of pnp-transistor $T_6$, whose emitter electrode is connected to the positive supply-terminal 3. The base electrodes of transistors $T_4$ and $T_5$ are connected to the power supply terminal 3 via the collector resistors of transistors $T_1$ and $T_2$. As the base-emitter junction of transistor $T_6$ reduces the collector voltage of transistor $T_5$ in comparison with the collector voltage of transistor $T_4$, the associated base electrodes being connected to the power-supply terminal 3 via the collector resistors of transistors $T_1$ and $T_2$, across which resistors a small voltage drop occurs, the base current of transistor $T_5$ is larger than that of transistor $T_4$. This effect is further enhanced because, as will be explained, transistor $T_5$ carries more current than transistor $T_4$ at the instant that the current discrimination arrangement becomes bistable. As a result of this inequality of the base currents, which base currents flow via the resistors 1 and 2, the base of transistor $T_1$ is biased to a higher voltage than the base of transistor $T_2$, so that transistor $T_2$ will be cut off when the current discrimination arrangement becomes bistable.

If the current I is smaller than 2(KT/qR), both transistor $T_1$ and transistor $T_2$ will conduct. Transistor $T_5$ is conductive and drives transistor $T_6$. At the bistable instant when $I=2(KT/qR)$ transistor $T_2$ is turned off very hard, so that transistor $T_4$ is driven into full conduction and transistor $T_5$ and transistor $T_6$ are cut off. This means that for $I=2(KT/qR)$ the collector current of transistor $T_6$ will vary substantially in the case of a small variation of the current I. Current stabilization is then achieved by controlling the current I by means of the collector current of transistor $T_6$; in the present case this is effected via a current mirror whose input circuit comprises a transistor $T_8$, arranged as a diode, in series with a resistor 9, and whose output circuit comprises the resistor 8 and the transistor $T_3$. As a result of this, the current I will be stablized at a value $I=2(KT/qR)$. By connecting, for example an output 11 to the base of transistor $T_8$, a stabilized reference voltage will be available.

In order to obtain a maximum control range it is advantageous to offset the differential amplifier $T_4$, $T_5$ for a current I below the value $I=2(KT/qR)$, i.e. for $V=0$ in FIG. 2, so that the transistor $T_6$ supplies a maximum current and in such a way that for $\Delta V=V_0$ (FIG. 2) the differential amplifier is balanced. This is achieved by arranging resistors 16 and 7 between the resistors 1 and 2 and the associated collectors of transistors $T_1$ and $T_2$ and the associated base electrodes of transistors $T_4$ and $T_5$. The resistor 16 has such a larger value than resistor 7 that, for equal currents through said resistors, transistor $T_5$ carries the full current from the emitter-current source (10, 11, $T_7$). In a practical embodiment resistor 7 had a value 4R and resistor 6 a value 20R. Just before the bistable instant is reached for which $I=2(KT/qR)$, the input difference voltage of the differential amplifier is equal to $(21R-5R)\times(KT/qR)=16(KT/q)$, which is substantially equal to 400 mV. Moreover, resistors 16 and 7 provide an additional amplification for variations of I. The circuit arrangement shown in FIG. 3 further comprises a transistor $T_9$ arranged as a capacitance between terminal 4 and terminal 3 in order to increase the stability of the arrangement.

The voltage-reference arrangement shown in FIG. 3 is extremely suitable for very low supply voltages below 1.8 V and is capable of supplying reference voltages smaller than 1.1 V (on output 11).

What is claimed is:

1. A current stabilizing arrangement comprising a first transistor and a second transistor, each having a base electrode, an emitter electrode and a collector electrode, the collector electrode of the first transistor being connected to a first point by a first resistor and the collector electrode of the second transistor being connected to said first point by a second resistor of substantially the same value as the first resistor, the base electrode of the first transistor being connected to a point between the second resistor and the collector electrode of the second transistor, and the base electrode of the second transistor being connected to a point between the first resistor and the collector electrode of the first transistor, the emitter electrodes of the first and second transistors being connected to a second point, the circuit between the first point and the second point being arranged in series with an input for receiving an input current and an output being coupled to at least one of the two collector electrodes, characterized in that the arrangement comprises a controllable current source for supplying the input current to the input and a negative feedback path between the output and an input of the current source for adjusting the input current to the input to a value at which the operation of the current stabilizing arrangement becomes bistable.

2. A current stabilizing arrangement as claimed in claim 1, characterized in that the negative feedback path comprises a differential amplifier having a third transistor and a fourth transistor each having a base electrode, an emitter electrode and a collector electrode, with said emitter electrodes being connected together, the base electrode of the third transistor being connected to the collector electrode of the second transistor, the base electrode of the fourth transistor being connected to the collector electrode of the first transistor, the collector electrode of the third transistor being connected substantially directly to the first point, and a fifth transistor having a base electrode, an emitter electrode and a collector electrode, the collector electrode of the fourth transistor being connected to the base electrode of said fifth transistor, whose emitter electrode is also connected to the first point and whose collector electrode is coupled to the input.

3. A current stabilizing arrangement as claimed in claim 2, further comprising a current mirror circuit, characterized in that the collector of the fifth transistor is coupled to the input via said current mirror circuit.

4. A current stabilizing arrangement as claimed in claim 3, characterized in that the current mirror circuit comprises an input circuit including the series arrangement of a semiconductor junction and a resistor, which series arrangement is connected to an output for supplying a reference voltage.

5. A current stabilizing arrangement as claimed in claim 1, characterized in that a third resistor is connected between the collector electrode of the first transistor and the connection between the base electrode of the second transistor and the first resistor, and a fourth resistor whose resistance is higher than the resistance of the third resistor is connected between the collector electrode of the second transistor and the connection between the base electrode of the first transistor and the second transistor.

6. A current stabilizing arrangement as claimed in claim 5, further comprising a capacitance, characterized in that said capacitance is connected between the collector electrode of the second transistor and the first point.

* * * * *